(12) United States Patent
Chen et al.

(10) Patent No.: US 7,011,432 B2
(45) Date of Patent: Mar. 14, 2006

(54) LIGHTING SOURCE STRUCTURE

(75) Inventors: Tony K. T. Chen, Pingjen (TW);
Ming-Chung Chiu, Shinyi Chiu Keelung (TW)

(73) Assignee: Quarton, Inc., (TW)

( * ) Notice: Subject to any disclaimer, the term of this patent is extended or adjusted under 35 U.S.C. 154(b) by 0 days.

(21) Appl. No.: 10/405,737

(22) Filed: Apr. 2, 2003

(65) Prior Publication Data

US 2004/0085766 A1    May 6, 2004

(30) Foreign Application Priority Data

Nov. 5, 2002 (TW) .............. 91217682 U
Nov. 5, 2002 (TW) .............. 91217683 U

(51) Int. Cl.
*F21V 14/00*    (2006.01)
(52) U.S. Cl. .............. 362/256; 362/249; 362/363; 313/111
(58) Field of Classification Search .......... 362/249, 362/255, 256, 311, 351, 362, 363; 313/636, 313/111
See application file for complete search history.

(56) References Cited

U.S. PATENT DOCUMENTS

| | | | |
|---|---|---|---|
| 6,220,722 B1 * | 4/2001 | Begemann | 362/231 |
| 6,361,190 B1 * | 3/2002 | McDermott | 362/310 |
| 6,450,661 B1 * | 9/2002 | Okumura | 362/240 |
| 6,499,860 B1 * | 12/2002 | Begemann | 362/230 |
| 6,502,956 B1 * | 1/2003 | Wu | 362/237 |
| 6,523,978 B1 * | 2/2003 | Huang | 362/252 |
| 6,561,680 B1 * | 5/2003 | Shih | 362/294 |
| 6,568,834 B1 * | 5/2003 | Scianna | 362/255 |
| 6,598,996 B1 * | 7/2003 | Lodhie | 362/249 |

* cited by examiner

*Primary Examiner*—John Anthony Ward
(74) *Attorney, Agent, or Firm*—Raymond Sun

(57) ABSTRACT

A lighting source structure has a base having at least one electrode coupled to a power source and a plurality of light sources, with each light source electrically coupled to the electrode to produce light when stimulated. The plurality of light sources are arranged on the base in a manner such that the light produced from the plurality of light sources is projected to form a lighted area that has a central focus point which is separate from the locations of each of the plurality of light sources.

13 Claims, 14 Drawing Sheets

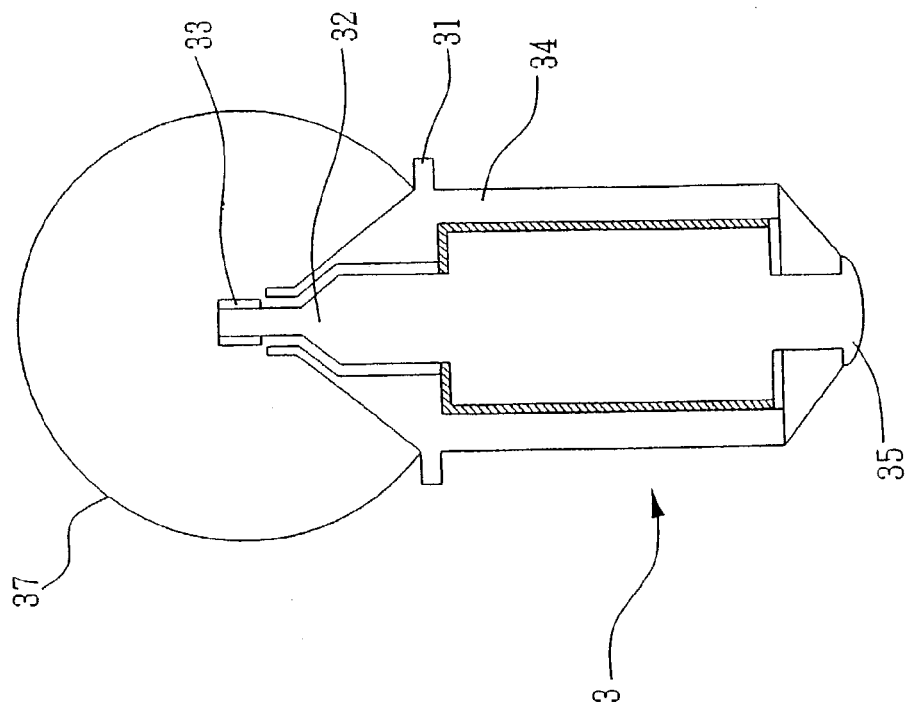
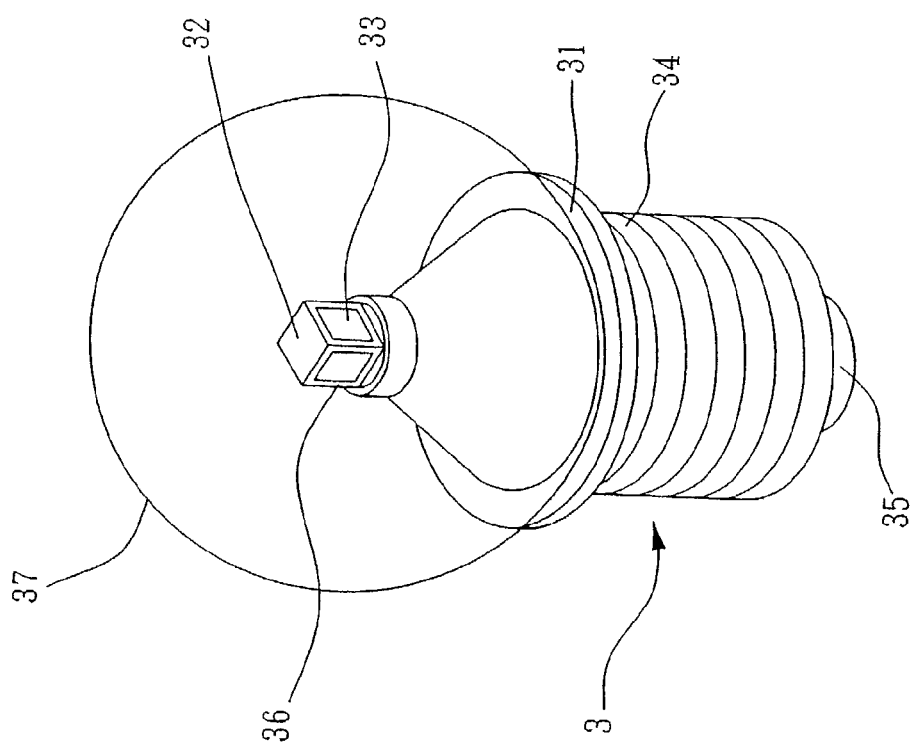
FIG. 3B
FIG. 3A

LIGHTING SOURCE STRUCTURE

BACKGROUND OF THE INVENTION

1. Field of the Invention

The invention relates to a lighting source structure, and in particular, to a lighting source structure that replaces the filament of a conventional light bulb with a lighting object that produces light.

2. Description of the Prior Art

Light bulbs are an indispensable part of our daily lives. FIG. 1 illustrates a conventional bulb 1 that uses a filament 5 for generating light. The filament 5 is connected to a first electrode 2 and a second electrode 3. The first electrode 2 and the second electrode 3 are connected to a base 4 and to an electrical power source. When conducted, the electrical power source will supply electricity to the filament 5 to cause it to generate light and heat. Since the conventional bulb 1 has many disadvantages (e.g., large consumption of energy and short life), light emitting diodes (LED) have gradually begun to replace conventional bulbs as light sources.

FIG. 2A illustrates a conventional LED lighting structure having an LED 11 that is positioned in the center of a metal reflector cup 12. An encapsulation tube 16, which is made of epoxy resin or its compounds, encapsulates the LED 11 and the metal reflector cup 12. The metal reflector cup 12 is connected to a first electrode 13. The LED 11 is connected to a metal conductive thin thread 15 that is connected to a second electrode 14. The first electrode 13 and the second electrode 14 are connected to a power source (not shown) which provides electricity to enable the LED 11 produce a light beam that projects from the hemispherical front end of the cup 12 to form a lighted area 18. The top surface 17 of the encapsulation tube 16 has a hemispherical configuration to function as a convex. The position of the LED 11 in FIG. 2A is the focus point 19 that is formed by the top surface 17 of the encapsulation tube 16 functioning as a convex, so that the light in the lighted area 18 will focus and be reflected to produce a light beam projecting out from the LED lighting structure.

LEDs provide numerous benefits when compared with incandescent and fluorescent illuminating devices, including lower power requirements, high efficiency and long life:

1. Low power requirement: Most types of LEDs can be operated with battery power supplies.

2. High efficiency: Most of the power supplied to an LED is converted into radiation in the desired form, with minimal heat production.

3. Long life: When properly installed, an LED can function for decades.

However, the lighting structure in FIG. 2A still suffers from some drawbacks since the configuration and structure of the reflector cup 12 and the encapsulation tube 16 tend to decrease the intensity and scope of the light that is projected from the LED 11. For example, as seen in FIG. 2A, the lighted area 18 is narrow. If the LED 11 can be moved closer to the top surface 17 while maintaining the same location for the focus point 19 (i.e., so that the LED 11 is now positioned between the focus point 19 and the top surface 17), as shown in FIG. 2B, the lighted area 18 will cover a wider area. However, the conventional LED bulbs that are available in the market cannot provide such improved lighting effects, thereby rendering such bulbs inappropriate for many applications.

SUMMARY OF THE DISCLOSURE

It is an objective of the present invention to provide a lighting source structure that produces visible light or non-visible light by stimulation, and which increases the life of the structure and reduces the consumption of electricity.

It is another objective of the present invention to provide a lighting source structure which has a plurality of light sources that are arranged so that the emitted light appears to be focused from one central point.

It is yet another objective of the present invention to provide an LED light source structure that can project light to form a wider lighted area.

In order to accomplish the objectives of the present invention, the present invention provides a lighting source structure having a base having at least one electrode coupled to a power source, a core extending from the base and having a plurality of sides, and a plurality of lighting objects, with each lighting object positioned at a separate side and electrically coupled to the electrodes to produce energy when stimulated.

The present invention also provides, in another embodiment, a lighting source structure having an LED lighting object electrically coupled to at least one electrode to produce light when stimulated, and an encapsulation tube that covers the LED lighting object, the encapsulation tube having an angled top surface and a side surface that is connected to the top surface at an angle. The light produced by the lighting object is reflected by the angled top surface and refracted by the side surface to form a lighted area.

In yet another embodiment, the present invention provides a lighting source structure having a base having at least one electrode coupled to a power source and a plurality of light sources, with each light source electrically coupled to the electrode to produce light when stimulated. The plurality of light sources are arranged on the base in a manner such that the light produced from the plurality of light sources is projected to form a lighted area that has a central focus point which is separate from the locations of each of the plurality of light sources.

BRIEF DESCRIPTION OF THE DRAWINGS

FIG. 3A is a perspective view of a first embodiment of a lighting source structure according to the present invention.

FIG. 3B is a cross-sectional view of the lighting source structure of FIG. 3A.

DETAILED DESCRIPTION OF THE PREFERRED EMBODIMENTS

Figures 1, 2A, 2B:
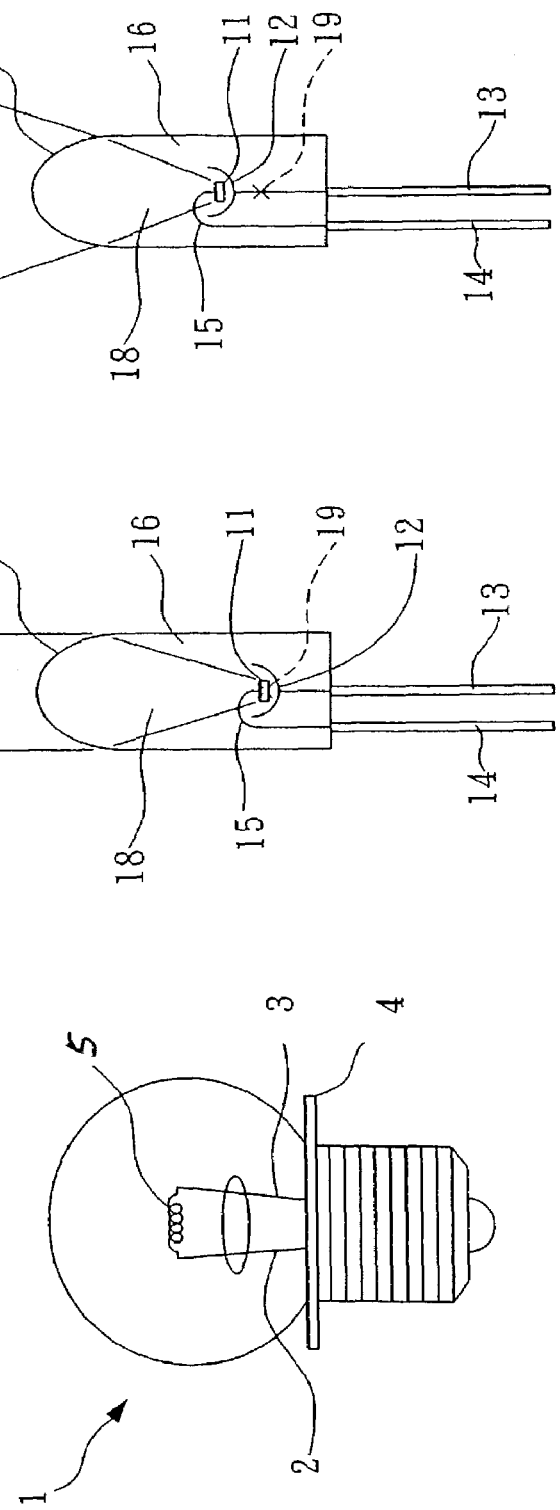
FIG. 1 is a cross-sectional view of a conventional bulb that uses a filament for generating light.
FIGS. 2A and 2B are cross-sectional views of a conventional LED lighting structure.

The following detailed description is of the best presently contemplated modes of carrying out the invention. This description is not to be taken in a limiting sense, but is made merely for the purpose of illustrating general principles of embodiments of the invention. The scope of the invention is best defined by the appended claims.

The present invention discloses lighting source structures that are provided with at least one lighting object which can be stimulated by energy (such as electricity) to generate visible or non-visible light. With the proper arrangement of a plurality of these lighting objects, the emitted light can be focused to act as a central lighting source to overcome the previous disadvantages experienced by the conventional lighting structures, such as short operation life, high consumption of electricity, and poor light focusing effect.

FIGS. 3A and 3B illustrate a first embodiment of a lighting source structure 3 according to the present invention. The lighting source structure 3 is connected to an electrical power source (not shown) to receive the needed power, and has a base 31, a core 32 and at least one lighting object 33. The base 31 has a first electrode 34 and a second electrode 35 that are coupled to the power source to deliver electricity to the first electrode 34 and the second electrode 35. In general, the core 32 can be a polygon-shaped cylinder and has a plurality of sides 36. In the embodiment shown in FIG. 3A, the core 32 is a rectangular-shaped cylinder that has four sides 36 at its top end. It is also possible to provide the core 32 as a triangular-shaped cylinder or a pentagonal-shaped cylinder without departing from the scope and the spirit of the present invention. The core 32 is connected to the base 31 and extends upwardly for a length from about the center of the base 31. Each lighting object 33 is connected to a corresponding side 36 of the core 32 and is also electrically connected to the first electrode 34 and the second electrode 35. The lighting object 33 can be an LED chip of similar device. When conducted with electricity, the lighting objects 33 will be stimulated to generate visible or non-visible light. The lighting source structure 3 can also include an encapsulation tube 37 that is connected to the base 31 and which encapsulates the core 32. The encapsulation tube 37 can made of a transparent material and protects the lighting object 33 from external impact and dirt.

Figure 3D:
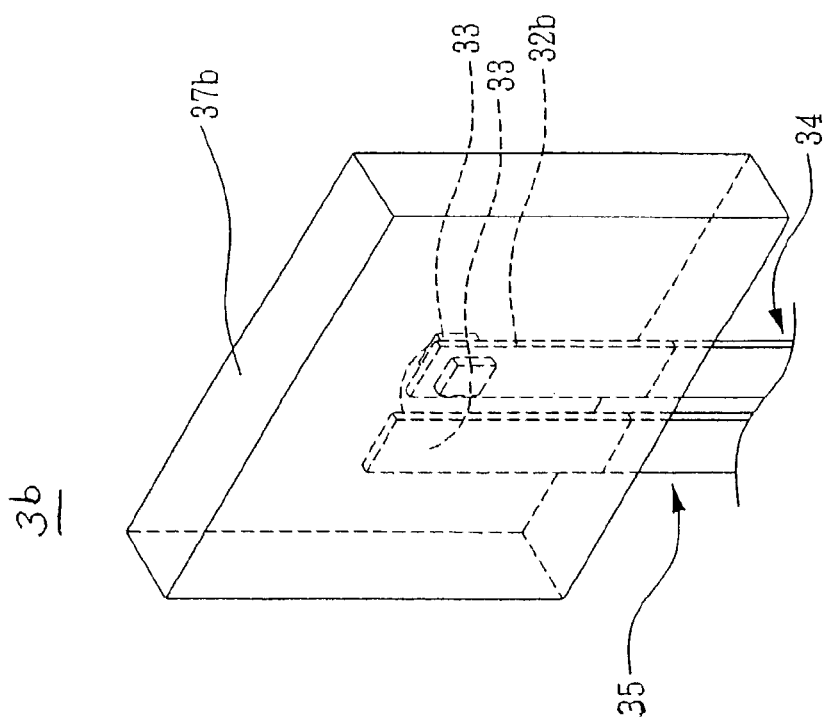
FIG. 3D is a perspective of a third embodiment of a lighting source structure according to the present invention.
Figure 3C:
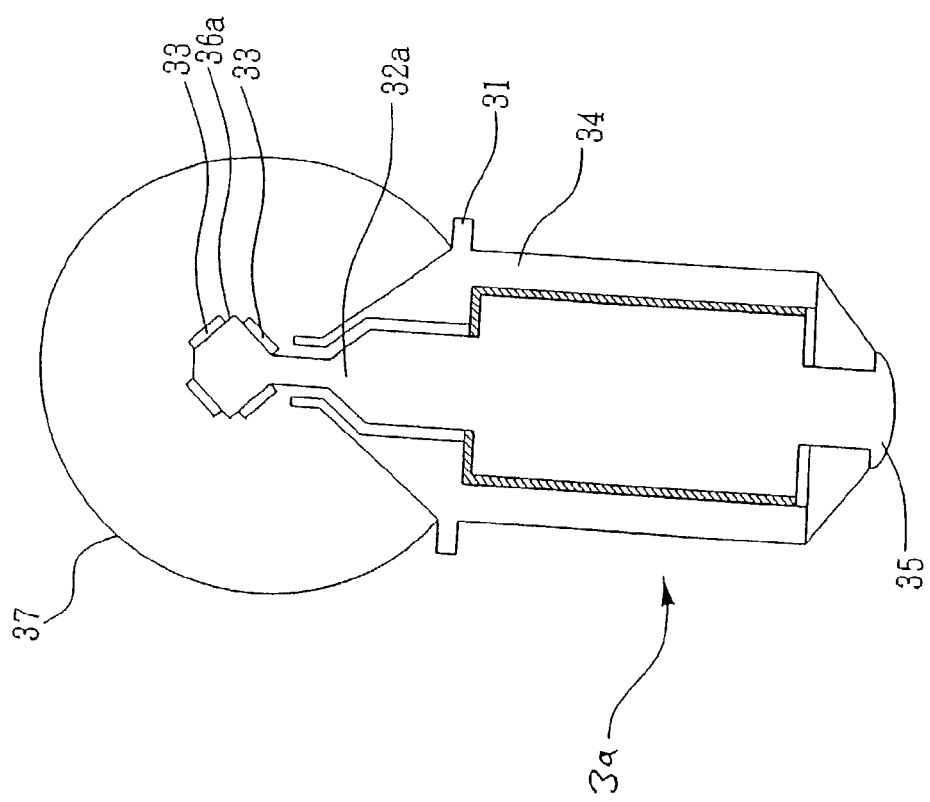
FIG. 3C is a cross-sectional view of a second embodiment of a lighting source structure according to the present invention.

FIG. 3C illustrates another embodiment of a lighting source structure 3a according to the present invention. The lighting source structure 3a is essentially the same as the lighting source structure 3, except that the core 32a in FIG. 3C is a polygon-shaped structure that has more than four sides 36a, such as six, eight of twelve sides 36a. The shape of the core 32a provides more than four sides 36a so that additional lighting objects 33 can be attached to the core 32a to produce a greater volume of light so as to create a larger lighted area. Other than the modifications noted above, the other elements 31, 33, 34, 35 and 37 in FIG. 3C are the same as those in FIG. 3A.

FIG. 3D illustrates yet another embodiment of a lighting source structure 3b according to the present invention. The lighting source structure 3b is essentially the same as the lighting source structure 3, except that the core 32b is embodied in the form of a strip of material having at least two opposites sides on which a separate lighting object 33 is attached. The encapsulation tube 37b is shaped as a rectangle as opposed to the spherical shape of the encapsulation tube 37 in FIG. 3A. Other than the modifications noted above, the other elements 33, 34 and 35 in FIG. 3D are the same as those in FIG. 3A.

Figure 4A:
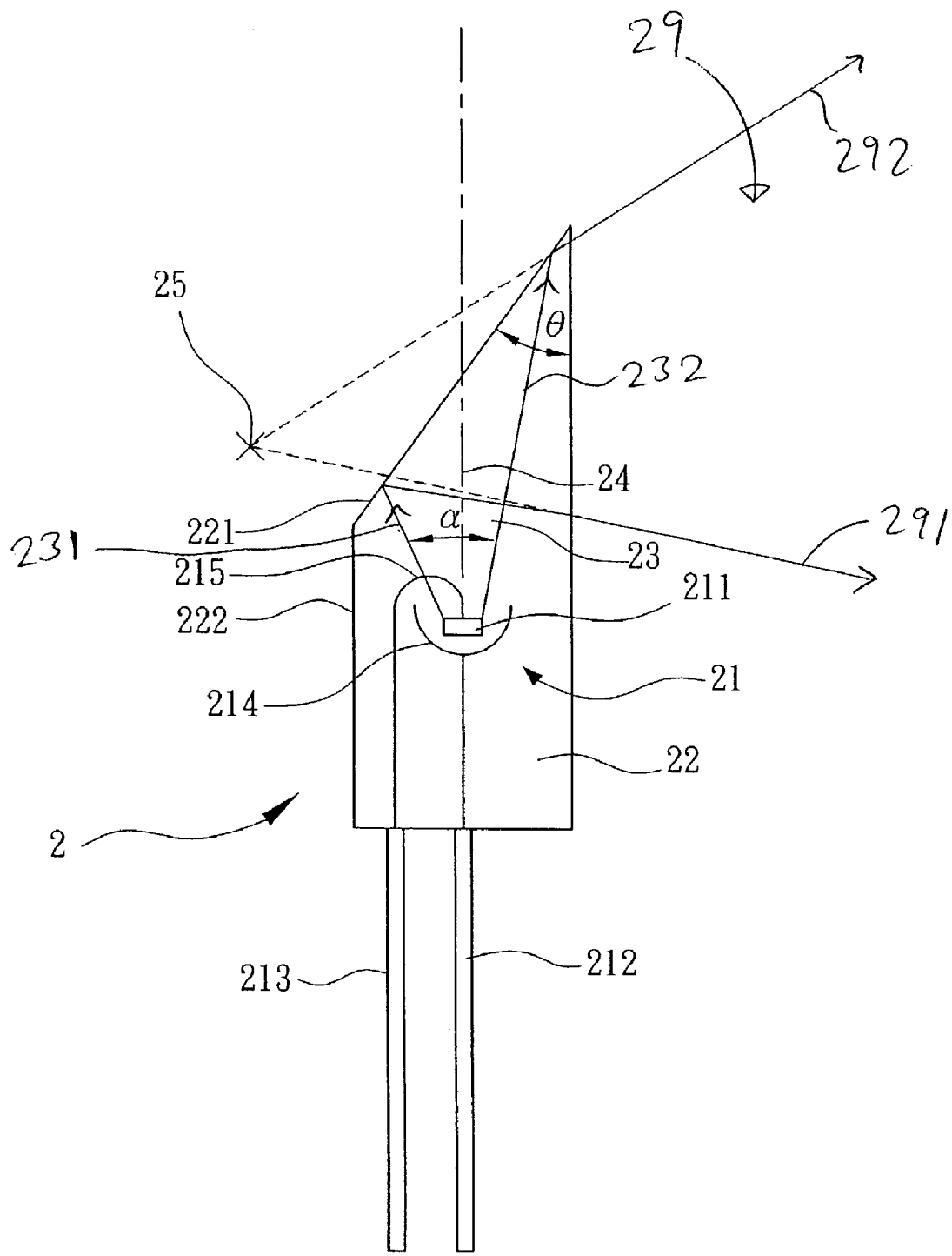
FIG. 4A is a perspective of a fourth embodiment of a lighting source structure according to the present invention.

FIG. 4A is a cross-sectional view of a Light Emitting Diode (LED) light source structure 2 according to the present invention, which has a lighting source 21 and an encapsulation tube 22. The lighting source 21 includes a lighting object 211 that is positioned in the center of a metal reflector cup 214 that is connected to a first electrode 212. The lighting object 211 can be a conventional LED, or a VCSEL chip, or the like. The lighting object 211 is further connected to a metal conductive thread 215 that is in turn connected to a second electrode 213. The electrodes 212 and 213 are connected to a power source (not shown) that provide electricity to enable the lighting object 211 to emit light projecting at a certain angle alpha to form a first lighted area 23. When conducted with electricity, the lighting object 211 will be stimulated to generate light and to project the light towards the first lighted area 23. Since the LED light source structure 2 is three-dimensional and symmetrical, a virtual normal line 24 is defined. The virtual normal line 24 extends outward from the center of the metal reflector cup 214 and the first lighted area 23 expands with the virtual normal line 24 along the center line so as to form a cone-shape for the first lighted area 23. The first lighted area 23 is defined by two borders 231 and 232.

The encapsulation tube 22 can be cylindrical and made of transparent material (plastics, epoxy resin, or similar compounds) to encapsulate the lighting object 211. The encapsulation tube 22 can have a cylindrical, rectangular or polygonal configuration. The encapsulation tube 22 has an angled top surface 221 connected to a cylindrical side surface 222 at a certain angle beta. The top surface 221 reflects the light emitted from the lighting object 211, and then the side surface 222 refracts the light reflected from the top surface 221 to form a second lighted area 29. Specifically, the light emitted from the lighting object 211 defines two borders 291 and 292. One border 291 originates as border 231 of the first lighted area 23 and is reflected by the top surface 221 towards the side surface 222, which then refracts this reflected light to define the lower border of the second lighted area 29. Similarly, the other border 292 originates as border 232 of the first lighted area 23 and is reflected by the top surface 221 towards the side surface 222, which then refracts this reflected light to define the upper border of the second lighted area 29. As a result, the second lighted area 29 appears to be emitted from a focus point 25 (i.e., by a central lighting source 25). The central lighting source 25 is located at a position separate from the actual position of the lighting object 211.

The reflection of the light projected from the lighting object 211 can be accomplished in several ways. In one embodiment of the present invention, the LED light is projected from a medium having a high refractive index to a medium having a low refractive index to create a total internal reflection effect at the top surface 221. In another embodiment, a reflecting film (not shown) can be coated on the top surface 221 to reflect the light in the lighted area 23. When the reflected light passes through the side surface 222, the light will be refracted and expanded around the outside area of the side surface 222 since the encapsulation tube 22 and the external air are of different mediums. As shown in FIG. 4A, the light focus 25 and the second lighted area 29 are located on two different sides of the side surface 222.

Figure 4B:
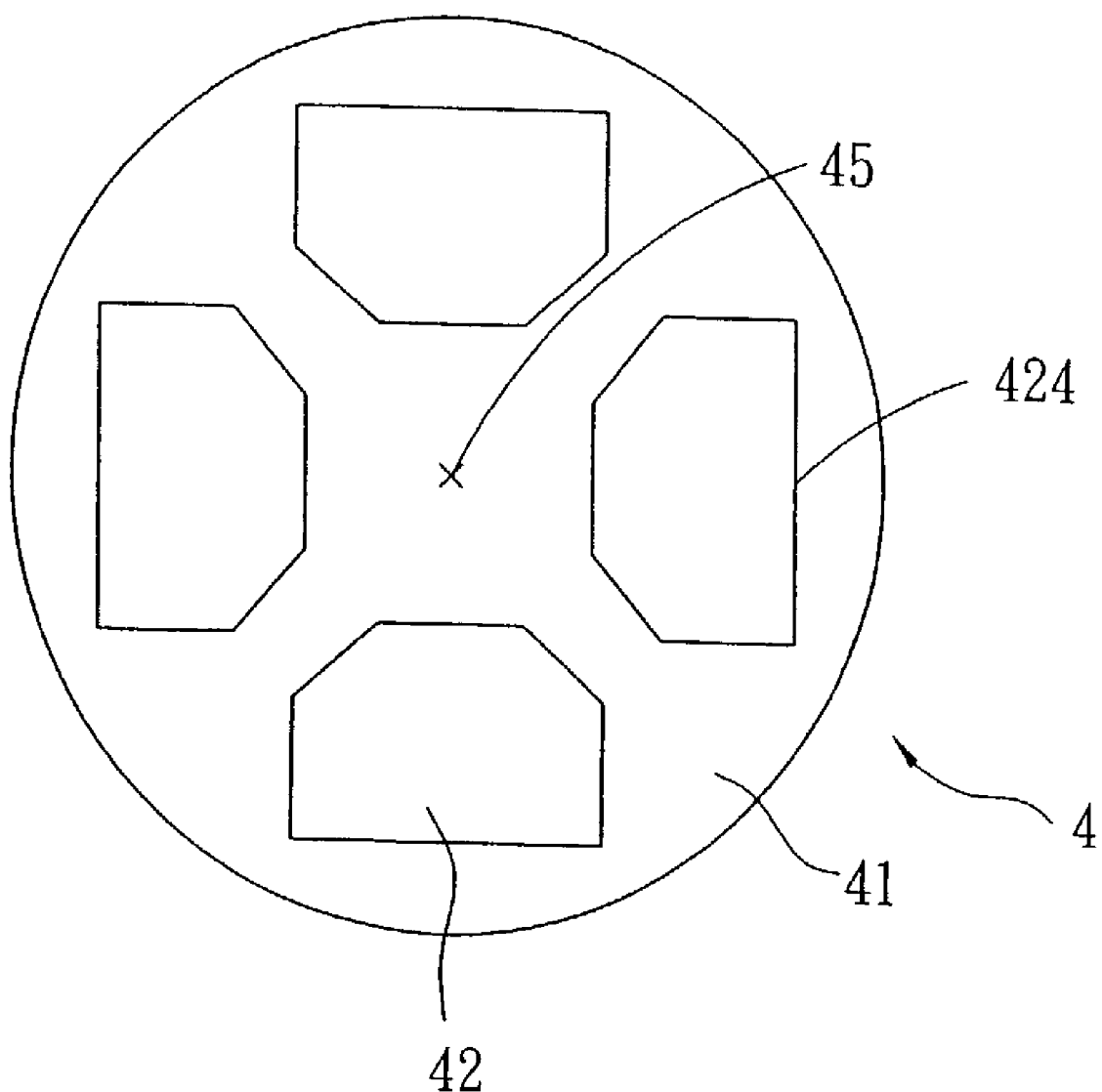
FIG. 4B is a top plan view of a fifth embodiment of a lighting source structure with four lighting sources according to the present invention.
Figure 4C:
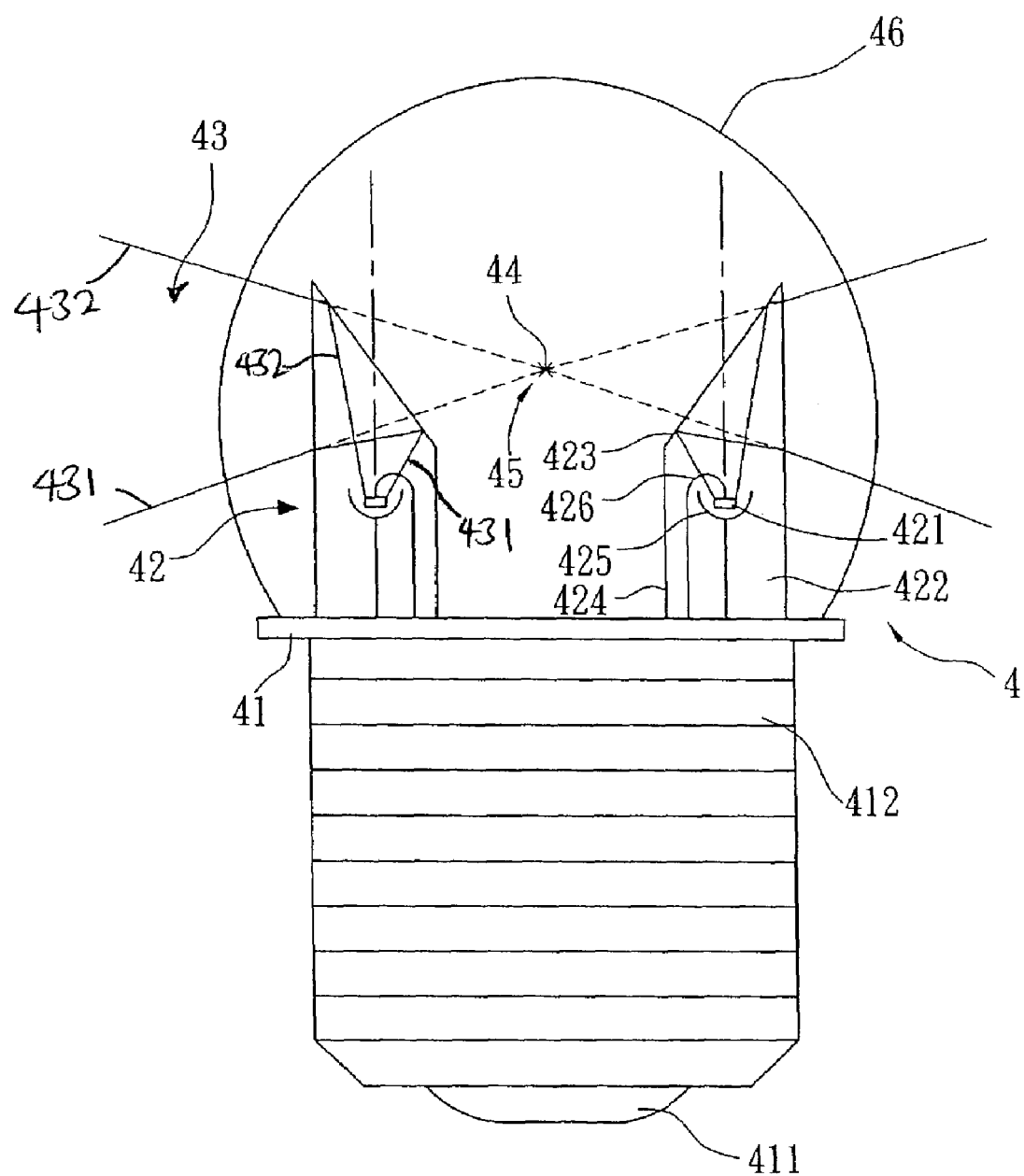
FIG. 4C is a cross-sectional view of the lighting source structure of FIG. 4A.
Figure 4D:
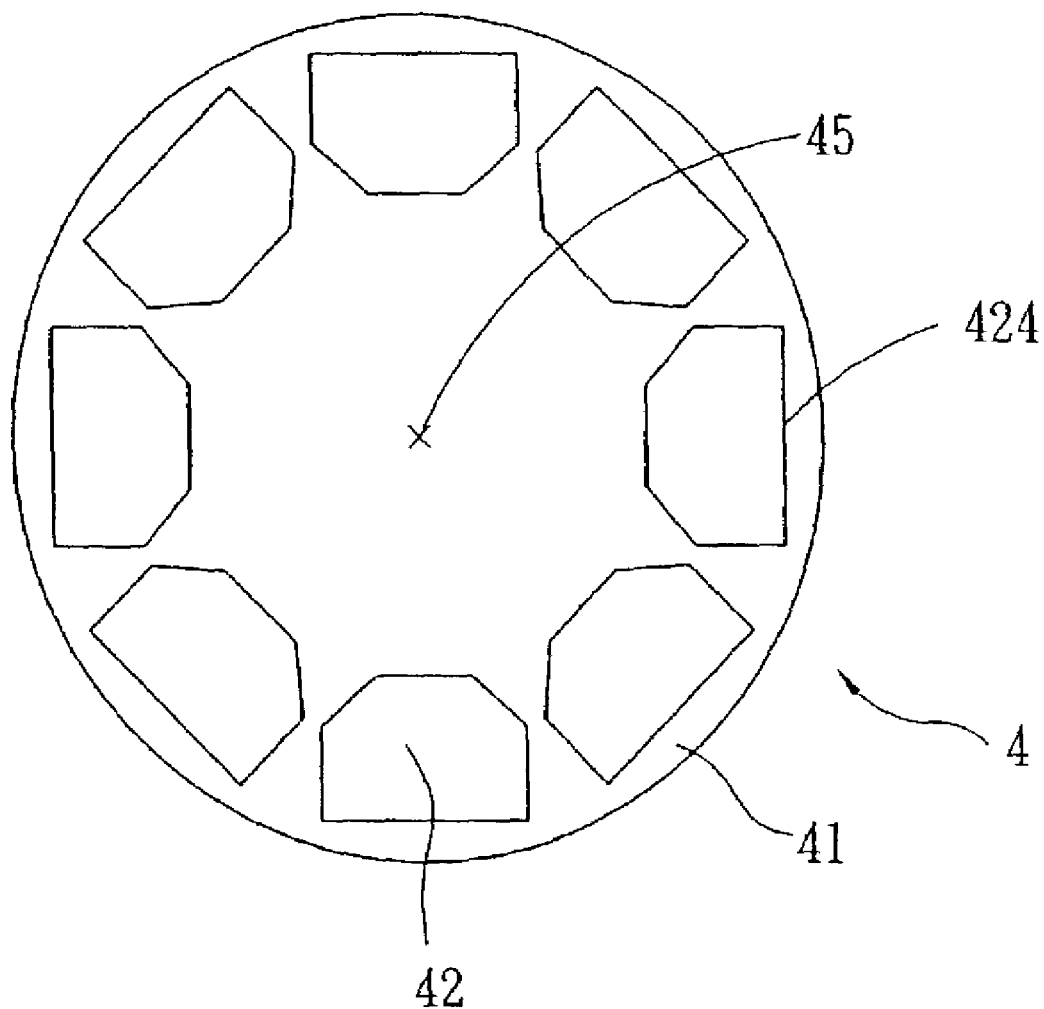
FIG. 4D is a top plan view of the lighting source structure of FIG. 4A shown with some modifications made thereto.

FIGS. 4B and 4C illustrate yet another embodiment of a lighting source structure 4 according to the present invention. The lighting source structure 4 utilizes a plurality of lighting sources 42 that have the same construction and function as the lighting source structures 2 in FIG. 4A. The lighting source structure 4 has a base 41 and a plurality of lighting sources 42. An enclosing bulb 46 is secured to the base 41 and houses the lighting sources 42 therein. The base 41 has a first electrode 411 and a second electrode 412 that are coupled to an electrical power source (not shown) so that electricity can be transferred to the first electrode 411 and the second electrode 412. Four lighting sources 42 are arranged symmetrically in a circular manner on the base 41. The number of lighting sources 42, and their arrangements, can be varied without departing from the scope and the spirit of the present invention. For example, FIG. 4D illustrates the provision of eight lighting sources 42 arranged symmetrically in a circular manner on the base 41. The lighting sources 42 are electrically coupled to the first electrode 411 and the second electrode 412. When conducted with electricity, each lighting source 42 will be stimulated to generate light and to project the light towards a generally circumferential lighted area 43 in the manner described hereinbelow. The lighted area 43 extends around the outer circumference of the bulb 46 and appears to originate from a focus point 44. This light can be visible or non-visible.

In the embodiment of FIGS. 4B and 4C, each lighting source 42 includes at least one lighting object 421 and an encapsulation tube 422. The lighting object 421 is positioned in the center of a metal reflector cup 425 that is connected to the first electrode 411. The lighting object 421 can be the same as lighting object 211, such as a conventional LED. The lighting object 421 is further connected to a metal conductive thread 426 that is in turn connected to the second electrode 412. The first electrode 411 can also be designed to connect the metal conductive thread 426 directly. When connected electrically, the lighting source 42 will be stimulated to emit light to the lighted area 43. The encapsulation tube 422 can be cylindrical and made of epoxy resin to encapsulate the lighting object 421. The encapsulation tube 422 has an angled top surface 423 and an annular side surface 424 that are connected to each other in a manner such that the top surface 423 is angled with respect to the side surface 424 and the base 41, with the top surface 423 facing the interior of the bulb 46. The top surface 423 reflects the light emitted from the lighting object 421, and then the side surface 424 refracts the light reflected from the top surface 423 to form the lighted area 43. Specifically, the light emitted from the lighting object 421 defines two borders 431 and 432. One border 431 of the light is reflected by the top surface 423 towards the side surface 424, which then refracts this reflected light out of the bulb 46 to define the lower border of the lighted area 43. Similarly, the other border 432 of the light is reflected by the top surface 423 towards the side surface 424, which then refracts this reflected light out of the bulb 46 to define the upper border of the lighted area 43. As a result, the circumferential lighted area 43 appears to be emitted by a central lighting source 45 from a focal point 44. The central lighting source 45 is located at a position separate from the actual positions of the lighting objects 421. Here, even though the side surfaces 424 are configured as flat planar surfaces, it is possible to provide any of the side surfaces 424 in a curved shape to obtain better focusing.

Figure 5:
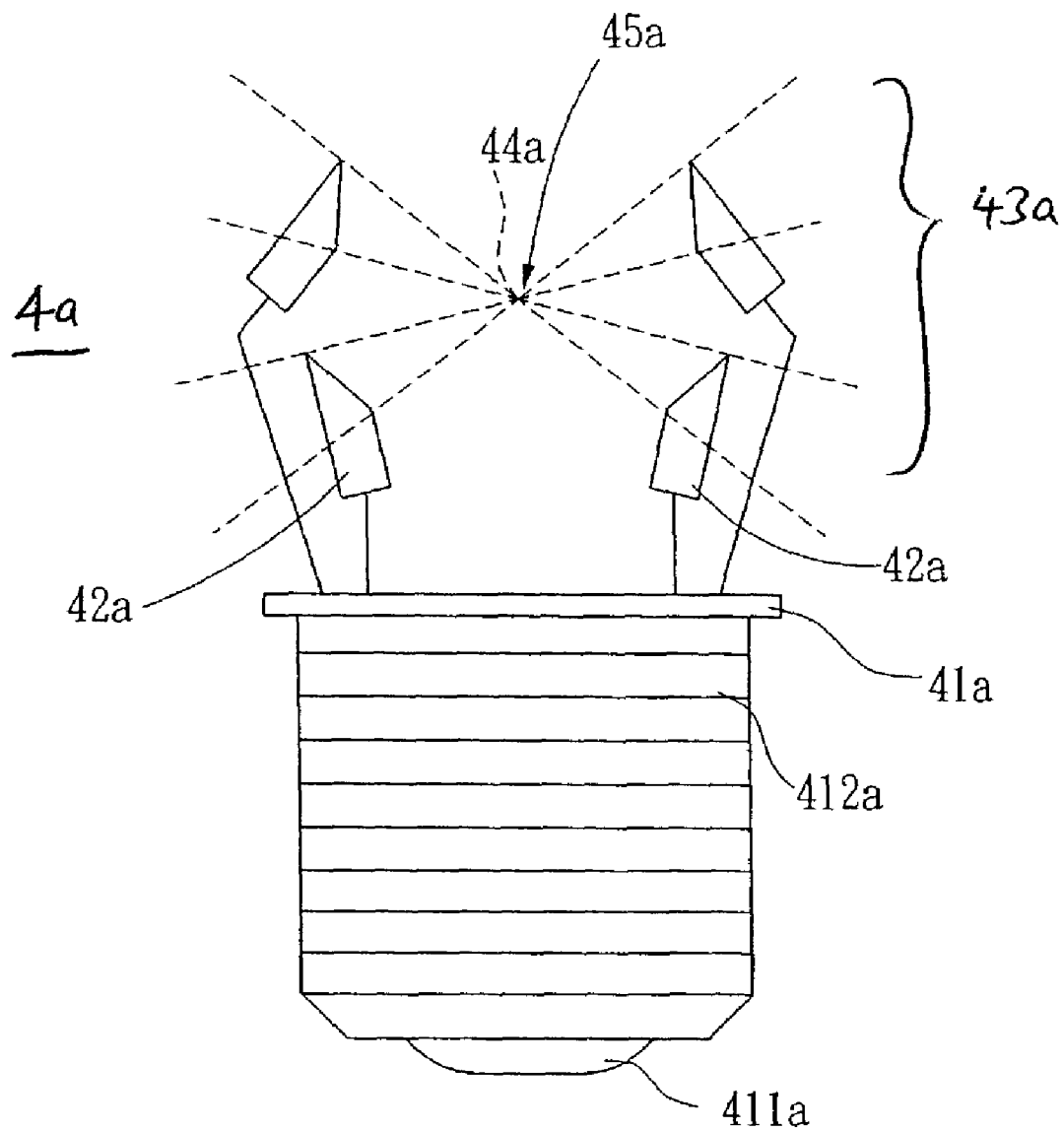
FIG. 5 is a cross-sectional view of a sixth embodiment of a lighting source structure according to the present invention.

FIG. 5 is a cross-sectional view of another embodiment of a lighting source structure 4a according to the present invention. The lighting source structure 4a has a plurality of lighting sources 42a that can be identical in structure and function to the lighting sources 42 disclosed in connection with FIGS. 4B and 4C above. The plurality of lighting sources 42a are positioned on the base 41a in a generally spherical arrangement. For example, the lighting sources 42a are arranged into two annular rows of lighting sources 42a, with a lower row of lighting sources 42a angled upwardly and an upper row of lighting sources 42a angled downwardly. Applying the same light paths illustrated in FIG. 4C, the lower row of lighting sources 42a would define the lower border of the circumferential lighted area 43a, while the upper row of lighting sources 42a would define the upper border of the circumferential lighted area 43a. In any case, there is a greater number of lighting sources 42a in FIG. 5 than in FIG. 4C, so that the lighting source structure 4a actually defines a larger lighted area 43a to provide a more effective focusing effect. The circumferential lighted area 43a appears to be emitted by a central lighting source 45a from a focal point 44a, with each lighting source 42a being positioned at an equal distance from the focal point 44a. Other than the modifications noted above, the electrodes 411a and 412a in FIG. 5 can be the same as the electrodes 411 and 412, respectively, in FIG. 4C.

Figure 6A:
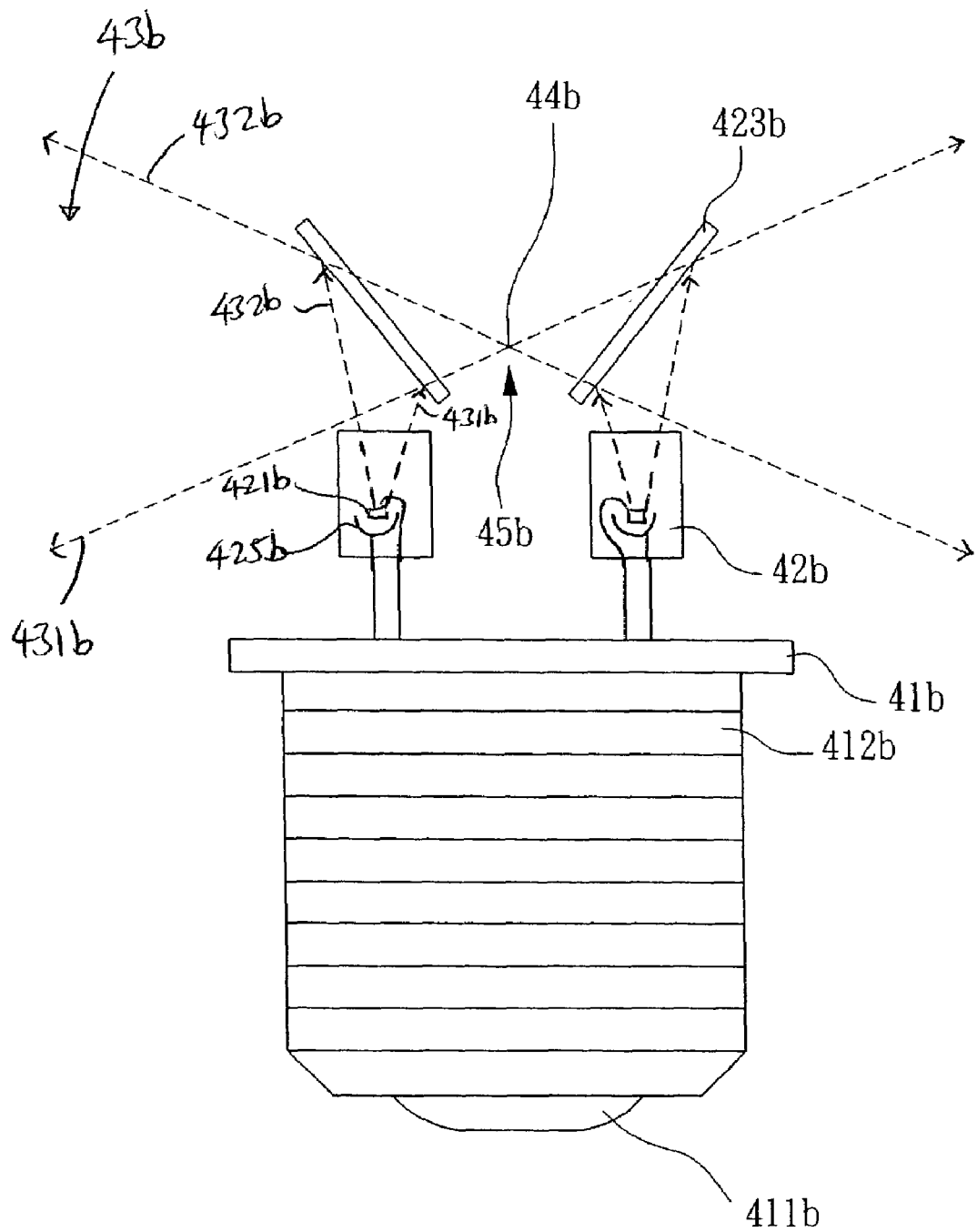
FIG. 6A is a cross-sectional view of a seventh embodiment of a lighting source structure according to the present invention.

FIG. 6A illustrates a modification that can be made to the lighting source structure 4 in FIG. 4C. In FIG. 6A, the side surface 424 of each lighting source 42b is omitted, and each top surface 423 is replaced by an angled and outwardly-facing reflecting mirror 423b. Otherwise, the principles and operation of the lighting sources 42b in FIG. 6A are similar to those for the lighting sources 42 in FIG. 4C. For example, the mirror 423b reflects the light emitted from the lighting object 421b to create the lighted area 43b. Specifically, the light emitted from the lighting object 421b defines two borders 431b and 432b, with each border 431b and 432b of the light being reflected by the mirror 423b. As a result, the circumferential lighted area 43b appears to be emitted by a central lighting source 45b from a focal point 44b. Other than the modifications noted above, the electodes 411b and 412b in FIG. 6A can be the same as the electrodes 411 and 412, respectively, in FIG. 4C.

Figure 6B:
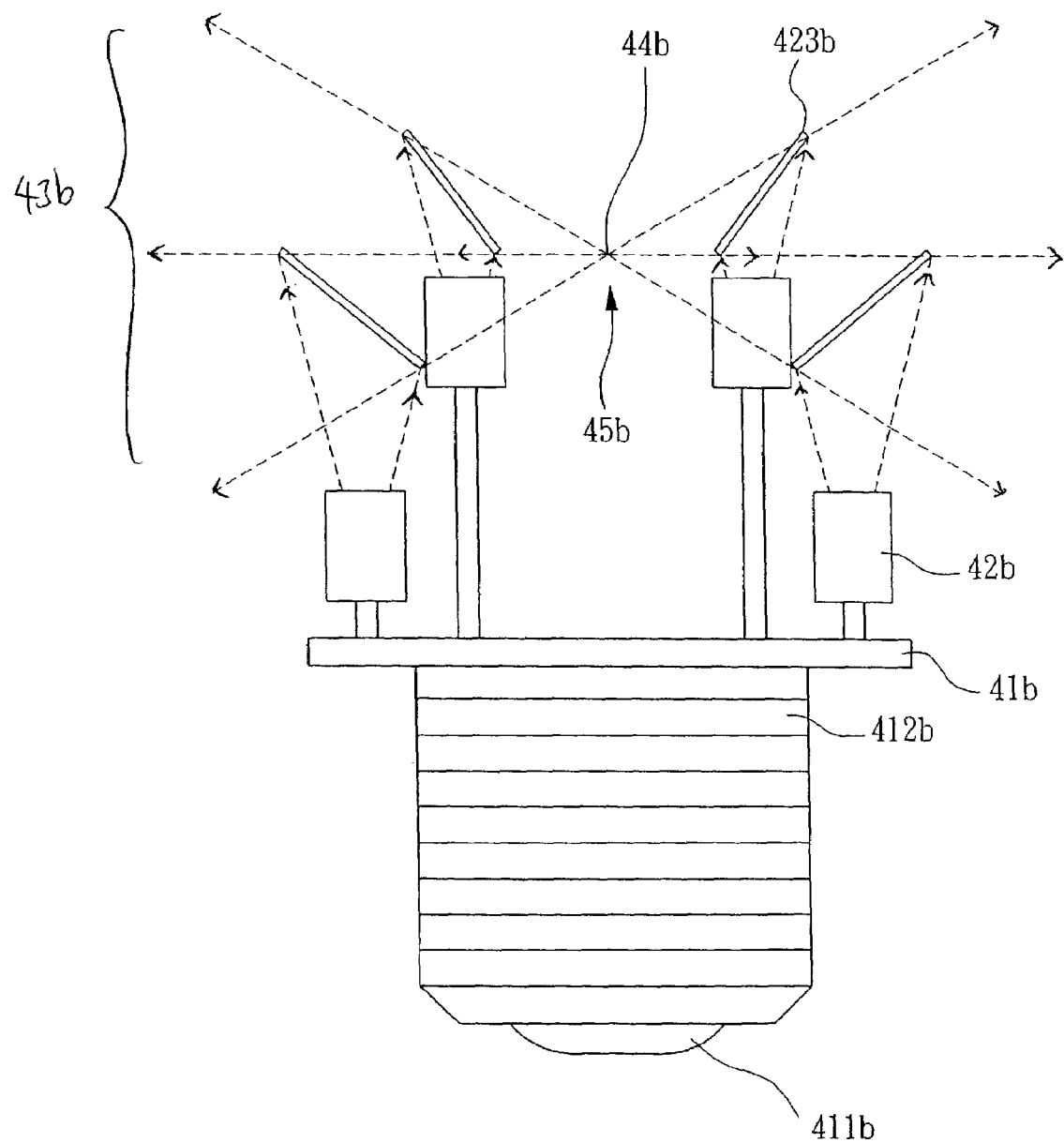
FIG. 6B is a cross-sectional view of an eighth embodiment of a lighting source structure according to the present invention.

FIG. 6B extends the principles shown in FIG. 6A to the lighting source structure 4a shown in FIG. 5. The same numerals are utilized to designate the same elements in FIGS. 5 and 6B except that a "b" is used in the designations in FIG. 6B, while an "a" is used in the designations in FIG. 5.

Figure 7A:
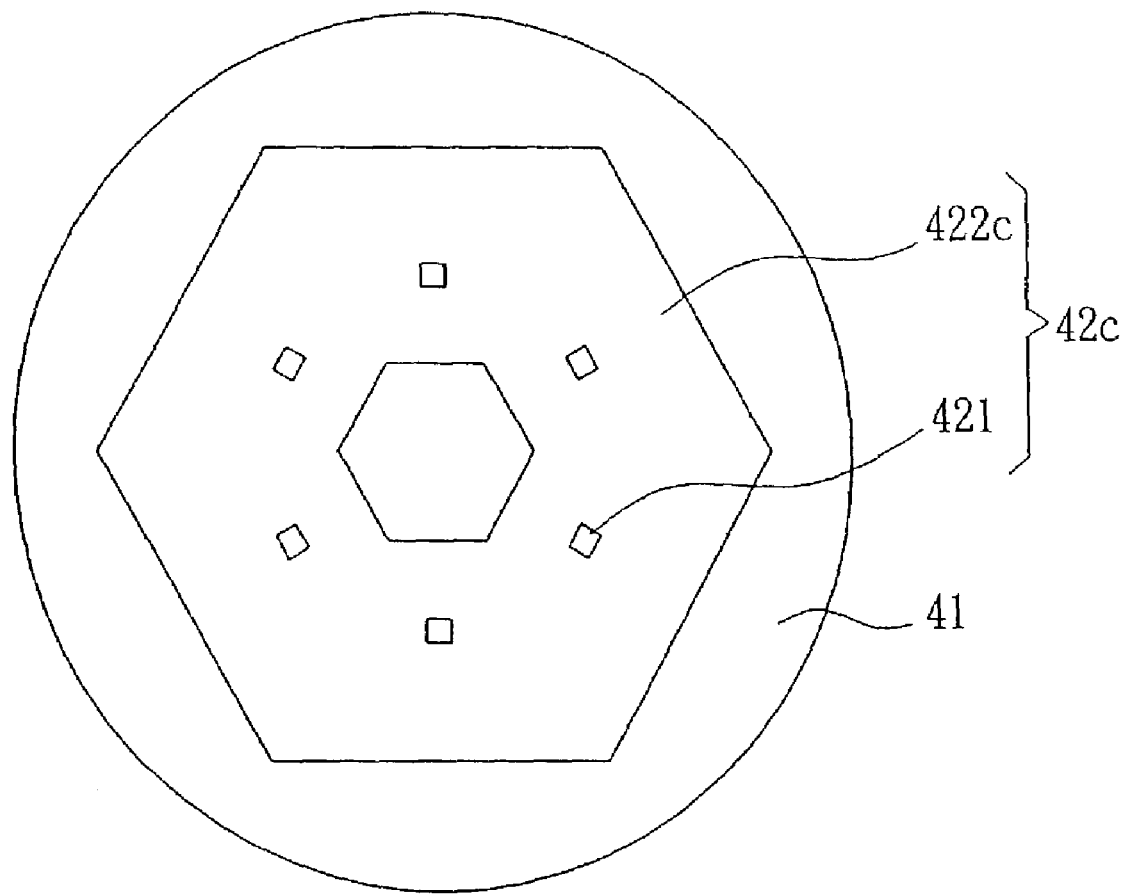
FIG. 7A is a top plan view of a ninth embodiment of a lighting source structure according to the present invention.
Figure 7B:
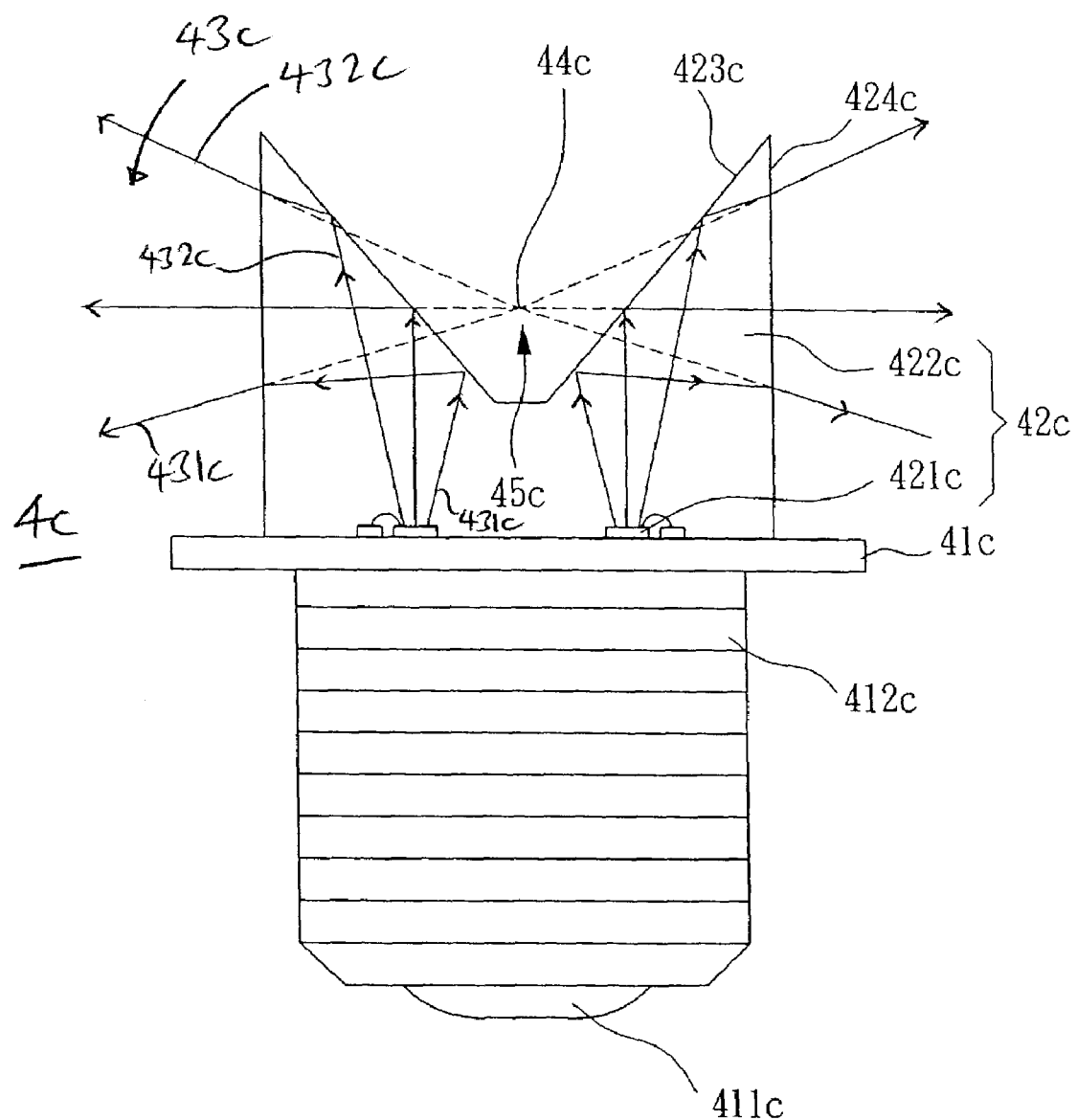
FIG. 7B is a cross-sectional view of the lighting source structure of FIG. 7A.

FIGS. 7A and 7B illustrate another embodiment of a lighting source structure 4c according to the present invention. The lighting source structure 4c is the same as the lighting source structure 4 in FIG. 4C, except that each lighting source 42c in FIG. 7B is modified so that the separate encapsulation tubes 422 for each lighting source 42 in FIG. 4C is now replaced by a single encapsulation member 422c in FIG. 7B that covers all the separate lighting sources 42c. Each lighting source 42c still has a respective lighting object 421c, with these lighting objects 421c arranged in a hexagonal arrangement on the base 41c, as best shown in FIG. 7A. Each lighting source 421c can be an LED chip that is directly packaged inside the encapsulation member 422c. The encapsulation member 422c is similar to the encapsulation tube 422 in that the encapsulation member 422c still has a cylindrical side surface 424c, and a generally V-shaped interior top surface 423c. The light emitted from each lighting object 421c defines two borders 431c and 432c. One border 431c of the light is reflected by the top surface 423c towards the side surface 424c, which then refracts this reflected light out of the encapsulation member 422c to define the lower border of the lighted area 43c. Similarly, the other border 432c of the, light is reflected by the top surface 423c towards the side surface 424c, which then refracts this reflected light out of the encapsulation member 422c to define the upper border of the lighted area 43c. As a result, the circumferential lighted area 43c appears to be emitted by a central lighting source 45c from a focal point 44c that is located at the indented or interior V-shaped region of the encapsulation member 422c. Other than the modifications noted above, the electodes 411c and 412c in FIG. 7B can be the same as the electrodes 411 and 412, respectively, in FIG. 4C. In addition, the reflection of the light projected from the lighting objects 421c can be accomplished in the same manner as described above for the lighting object 211.

Figure 8A:
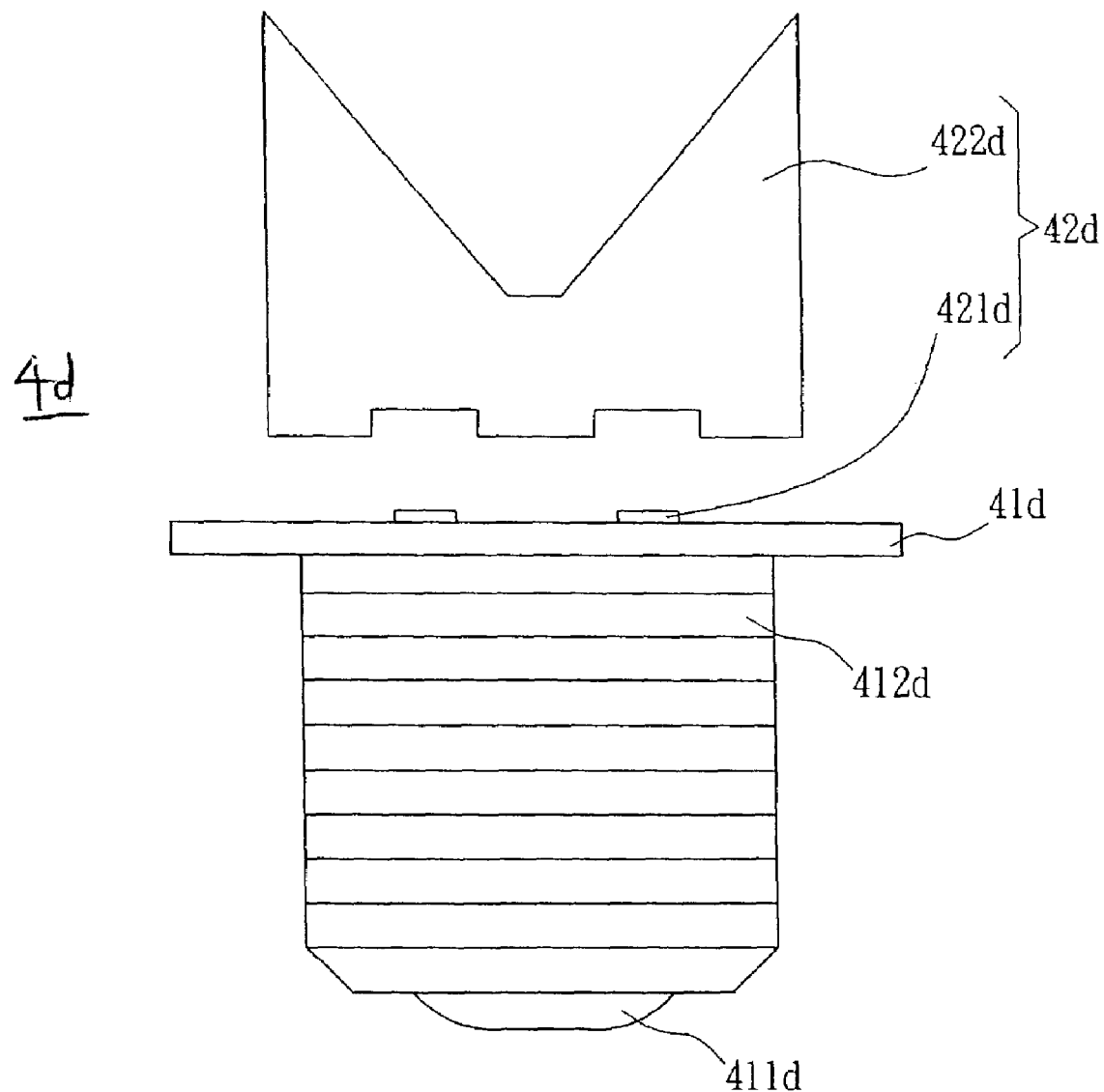
FIG. 8A is an exploded cross-sectional view of a tenth embodiment of a lighting source structure according to the present invention.
Figure 8B:
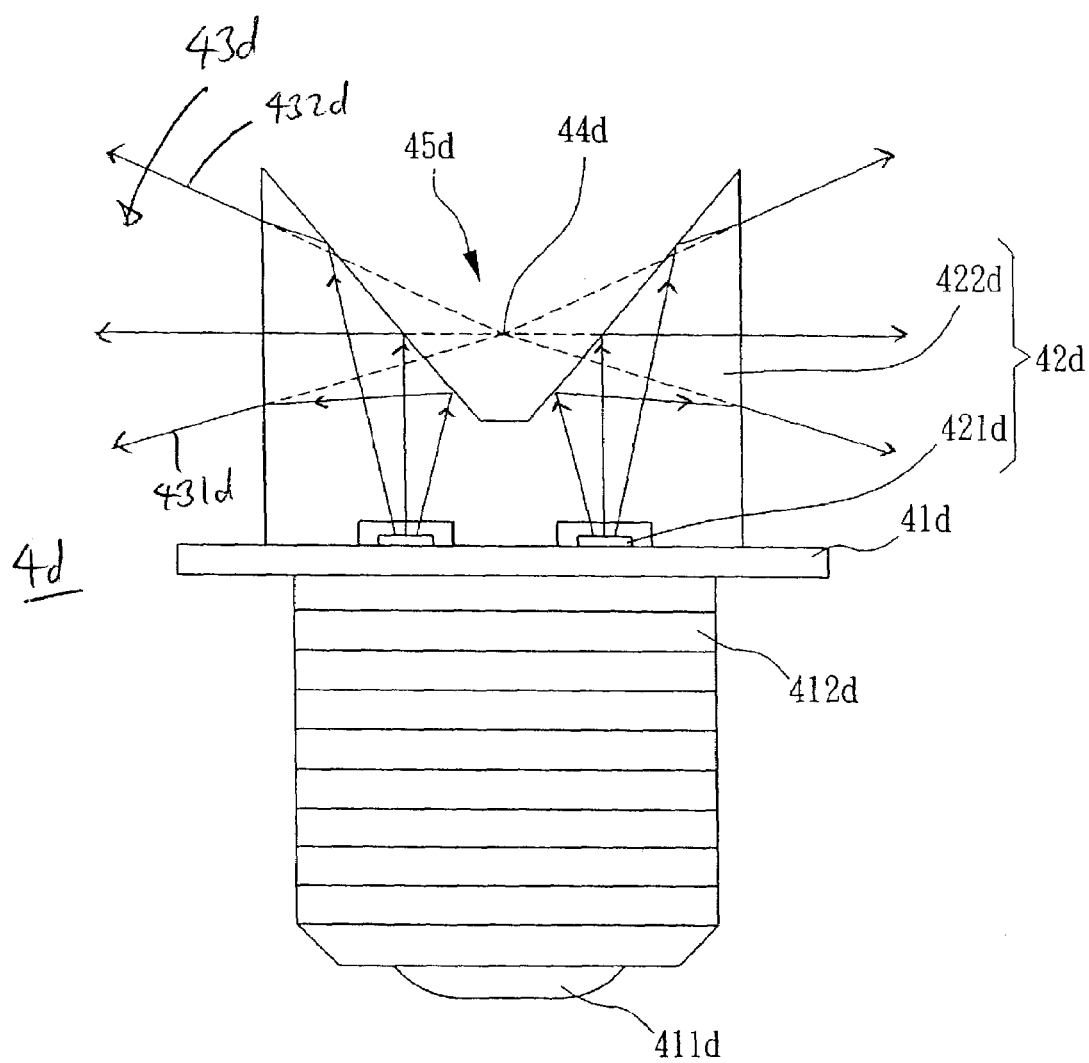
FIG. 8B is a cross-sectional view of the lighting source structure of FIG. 8A.

The lighting source structure 4d in FIGS. 8A and 8B is essentially the same as the lighting source structure 4c in FIG. 7B. Thus, the same numerals are utilized to designate the same elements in FIGS. 7B and 8B except that a "d" is used in the designations in FIG. 8B, while a "c" is used in the designations in FIG. 7B. The lighting objects 421d can be provided in the form of an LED chip, or an SMD type of LED. In addition, the encapsulation member 422d is shown as being provided in a single independently-manufactured piece which is then connected to the base 41d.

In summary, with the proper arrangement of a plurality of lighting sources 42, the lighting source structures according to the present invention can establish a central lighting source (i.e., at 45) that acts like a filament in a traditional bulb to produce light, but which does not experience the disadvantages of short life and high energy consumption. Also, by varying the number and arrangement of these lighting sources 42, the present invention can vary the scope and intensity of the emitted light.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. A lighting source structure, comprising:
   a base having at least one electrode coupled to a power source; and
   a plurality of light sources, with each light source electrically coupled to the at least one electrode to produce light and having a reflective surface;
   wherein the plurality of light sources is arranged on the base in a manner such that the light produced from the plurality of light sources is projected and reflected by each respective reflective surface to form a lighted area that has a central focus point which is separate from the locations of each of the plurality of light sources.

2. The structure of claim 1, wherein the lighted area is annular.

3. The structure of claim 1, wherein the focus point appears as a single central light source.

4. The structure of claim 1, wherein each light source comprises:
   a lighting object electrically coupled to the at least one electrode to produce light when stimulated;
   an encapsulation tube that covers the lighting object, the encapsulation tube having the reflective surface that reflects the light produced by the lighting object to form the lighted area.

5. The structure of claim 4, wherein each encapsulation tube further includes an annular side surface that is connected to the reflective surface, with the light produced by the lighting object being reflected by the reflective surface and refracted by the side surface to form the lighted area.

6. The structure of claim 4, wherein each light source further comprises a reflector cup electrically coupled to the at least one electrode, with the lighting object positioned at the center of the reflector cup.

7. The structure of claim 1, wherein the plurality of light sources are arranged to form a circle on the base.

8. The structure of claim 1, wherein the plurality of light sources are arranged in a polygonal manner on the base.

9. The structure of claim 1, wherein the plurality of light sources are arranged in a spherical manner on the base.

10. The structure of claim 9, wherein the plurality of light sources are arranged in two rows of light sources, with each row of light sources having a different elevation.

11. A lighting source structure, comprising:
    a base having at least one electrode coupled to a power source;
    a plurality of light sources, with each light source electrically coupled to the at least one electrode to produce light and having a reflective surface;
    wherein the plurality of light sources is arranged on the base in a manner such that the light produced from the plurality of light sources is projected and reflected by each respective reflective surface to form a lighted area that has a central focus point which is separate from the locations of each of the plurality of light sources; and
    further including a transparent encapsulation member that is connected to the base and which covers the plurality of light sources.

12. The structure of claim 11, wherein the focus point is located inside the encapsulation member.

13. The structure of claim 12, wherein the focus point is located at the center of the encapsulation member.

* * * * *